United States Patent [19]
Ku et al.

[11] Patent Number: 6,057,738
[45] Date of Patent: May 2, 2000

[54] HIGH DYNAMIC RANGE OPTICAL RECEIVER PREAMPLIFIER

[75] Inventors: Chung-Chiang Ku; Chao-Hui Lin, both of Hsinchu, Taiwan

[73] Assignee: Industrial Technology Research Insititute, Hsinchu, Taiwan

[21] Appl. No.: 09/252,247

[22] Filed: Feb. 8, 1999

[51] Int. Cl.[7] .............................. H03F 3/08; H03F 1/36
[52] U.S. Cl. ...................... 330/308; 330/110; 250/214 A
[58] Field of Search ................................. 330/308, 110; 250/214 A

[56] References Cited

U.S. PATENT DOCUMENTS

| 4,350,959 | 9/1982 | Rosenbaum | 330/110 |
| 5,708,392 | 1/1998 | Gross | 330/308 |

Primary Examiner—Robert Pascal
Assistant Examiner—Patricia Nguyen
Attorney, Agent, or Firm—Harold L. Novick; Nath & Associates

[57] ABSTRACT

An optical receiver preamplifier provides a transimpedance feedback path between the output node and the input node that comprises a feedback resister and the two diodes are coupled ("paralleled") in opposite direction. While the input current signal is too large, and the voltage reach the diode's threshold voltage. The preamplifier can provide current path passing the signal to solve the problem that charge-discharge time is not uniform and changed over duty-cycle. Further, the two diodes are coupled ("paralleled") in opposite direction make photo-diode working under the large-signal current by anode or cathode input. Thus, increase the dynamic range of the transimpedance preamplifier. Besides, the low impedance of series resistance connects with input node and feedback network. The influence of bandwidth and stability that the aforementioned two paralleled diodes resulted in diode junction capacitor will reduce due to the low impedance of series resistance. And more specifically, in high-speed application, also increase the impedance of series resistance.

7 Claims, 4 Drawing Sheets

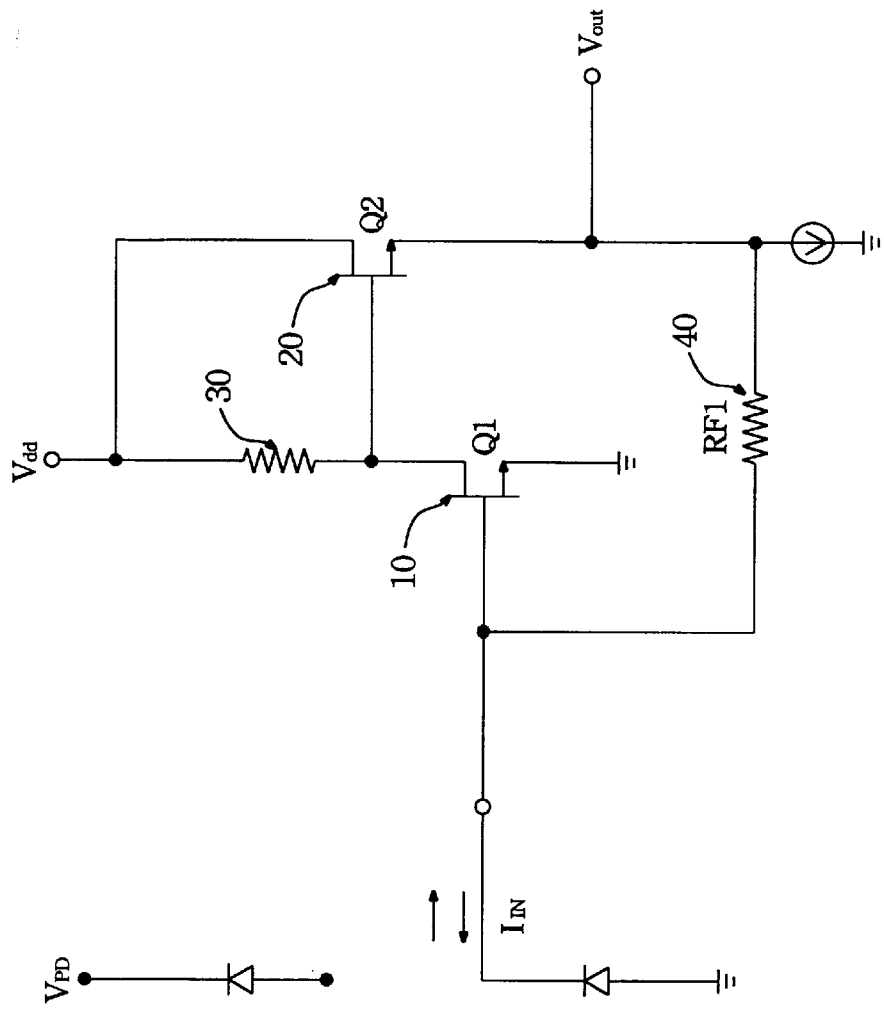
Fig.1a (Prior Art)
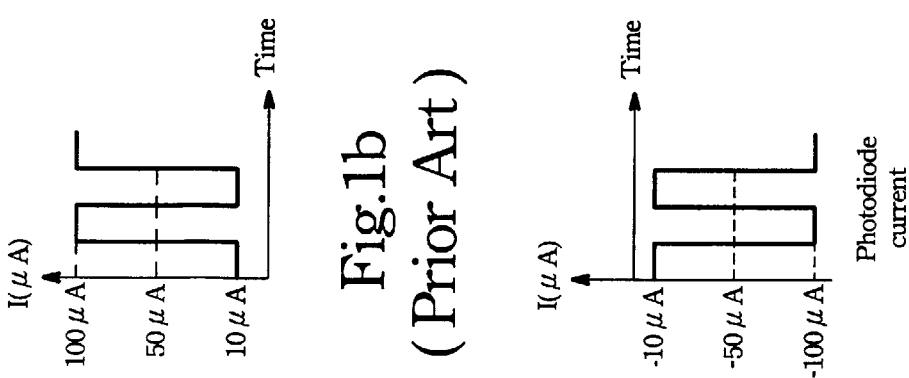
Fig.1b (Prior Art)
Fig.1c (Prior Art)

6,057,738

HIGH DYNAMIC RANGE OPTICAL RECEIVER PREAMPLIFIER

BACKGROUND OF THE INVENTION

1. Field of the Invention

The present invention relates to an optical receiver preamplifier, and more particularly to improved high dynamic range preamplifier.

2. Description of the Prior Art

A fiber receiver make use of the optical receiver preamplifier, the major function is that convert a current signal which is detected by a photo-diode into an amplified voltage signal. Then the signal flows into the post limiting amplifier. The transimpedance amplifier is the popular structure in the optical receiver preamplifier (shown in FIG. 1). As illustrated in FIG. 1, a transimpedance amplifier includes an input transister 10, an output transister 20, a load resistor 30, a feedback resistor 40 and a current signal source 50. The input current ($I_{IN}$) is applied to the gate of transistor 10 by the input node 12 and the output voltage ($V_{OUT}$) is derived from the source output node 22 of transistor 20, and therefore when the input current ($I_{IN}$) of transimpedance amplifier exceeds a certain value, the current signal source 50 shuts off and the circuit becomes inoperative. In order to solve the problem of limiting the dynamic range by the transimpedance feedback resistor. Traditionally, the prior art solution to the aforementioned problem has two methods (shown in FIG. 2): Automatic Gain Control and DC Restore Function. In other word, making use of feedback circuit to control the gain of the amplifier. While signal is strong, reducing the gain of the main amplifier through the feedback circuit, and while signal is weak, increasing the gain of the amplifier through the feedback circuit. Then sent the signal to the detector for profit by detecting (not shown in the drawings). It can increase high dynamic range by applying the control theorem. Nevertheless, the two methods must work on the output node by a detector to detect the input signal. Furthermore, through the low pass filter, comparator, and feedback to control the transimpedance feedback resistor. Due to the feedback control circuit both of the two methods, not only increase the complication and area of the circuit, but also induce more noise by the resister and transistor. It also causes the instability of the feedback control circuit. So the two methods must require much cost in practical design and application.

SUMMARY OF THE INVENTION

Referring to above the background of the invention. The most popular structure of the traditional preamplifier is using transimpedance. Due to the feedback control circuit both of the two methods, not only increase the complication and area of the circuit, but also cause the instability of the feedback control circuit. In order to maintain the bandwidth and stability of the circuit. The embodiment of the present invention will provide a transimpedance feedback path between the output node and the input node. That comprises a feedback resister and the two diodes are coupled ("paralleled") in opposite direction to solve the problem that charge-discharge time is not uniform and changed over duty-cycle (shown in FIG. 3).

According to another embodiment of the present invention, the low impedance of series resistance connects with input node and feedback network (shown in FIG. 4). The degree that the aforementioned two paralleled diodes effect the bandwidth and stability is depressed due to the low impedance of series resistor. And more specifically, in high-speed application, also increase the impedance of series resistance.

Referring to aforementioned purpose, present invention provides an input method that comprises anode input or cathode input to work on large signal current (shown in FIGS. 1b, 1c), and substantially improves traditional problem of the Automatic Gain Control and DC Restore Function.

The present invention improves high dynamic range preamplifier by using much less devices to maintain the bandwidth and stability of the circuit. Compared with the problem of Automatic Gain Control and DC Restore Function, certainly a valuable invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1a–1c are schematic diagrams of a prior art transimpedance amplifier;

DESCRIPTION OF THE PREFERRED EMBODIMENT

A preamplifier is an amplifier having low noise with specific bandwidth. The amplifier is connected behind the detector, so call it preamplifier. In general fiber optic communications, the output current of the detector is very weak. In order to work normal on receiver's determining, it is necessary to amplify current through multi-stage amplifier. In the multi-stage amplifier, post amplifier will amplify both the output signal and noise of the preamplifier. Namely, the noise induced by the preamplifier will amplify also together. Therefore, the preamplifier should have the characteristics of low noise and high gain, to obtain large signal-to-noise ratio.

Figure 2B:
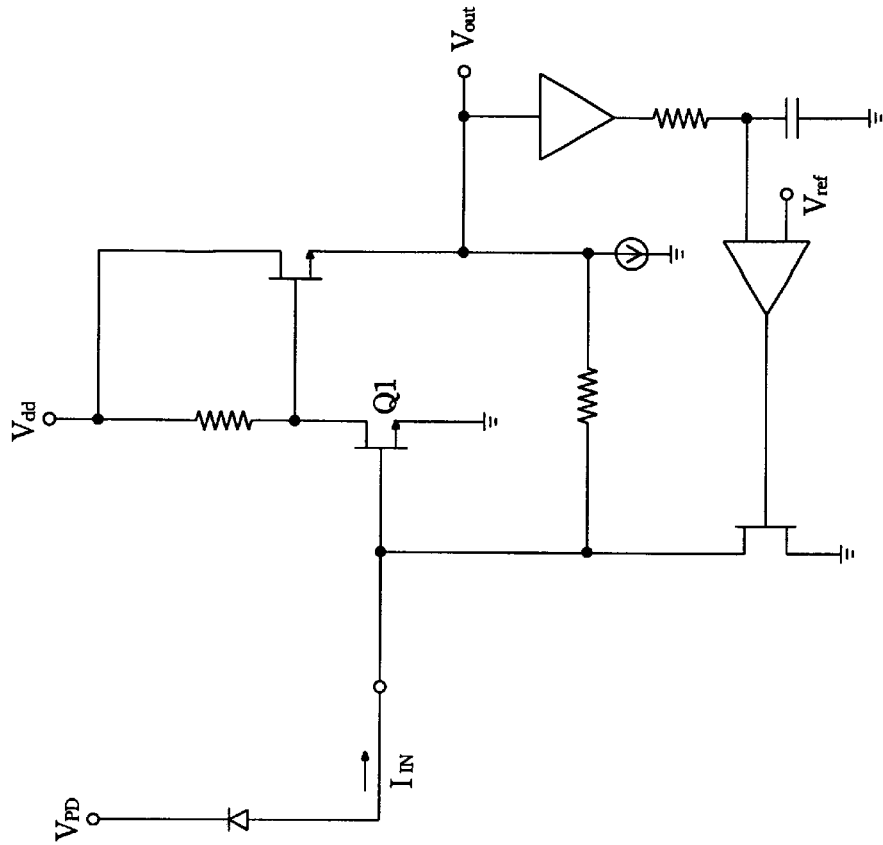
FIGS. 2a–2b are schematic diagrams of a prior art automatic gain control (AGC) and DC restore function.
Figure 2A:
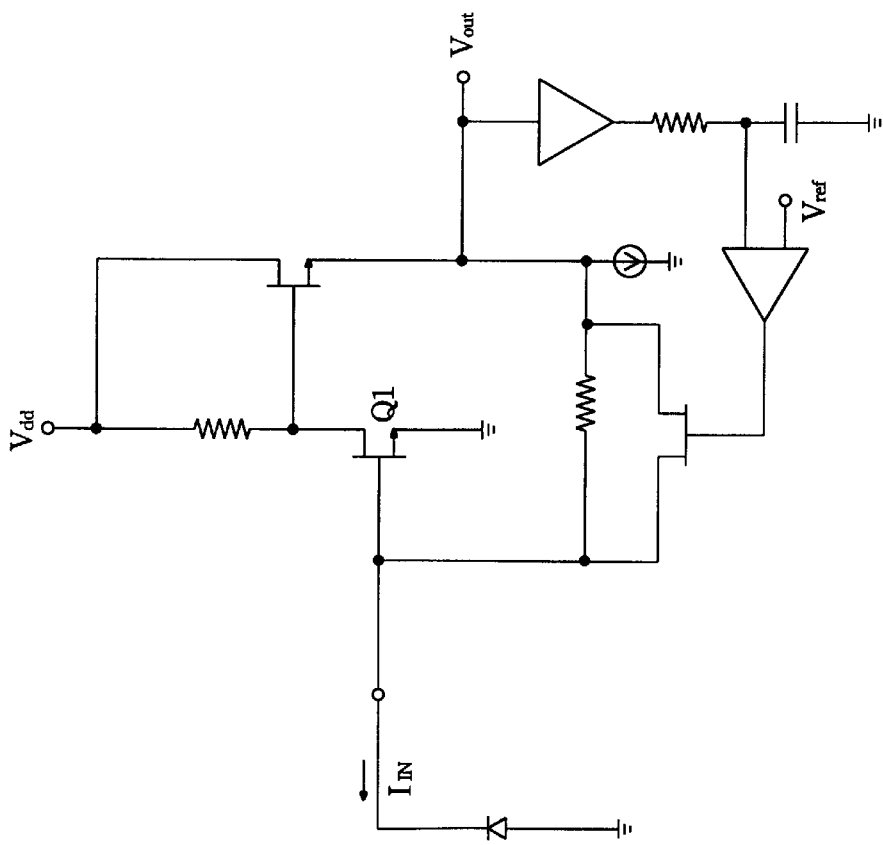
Figure 3:
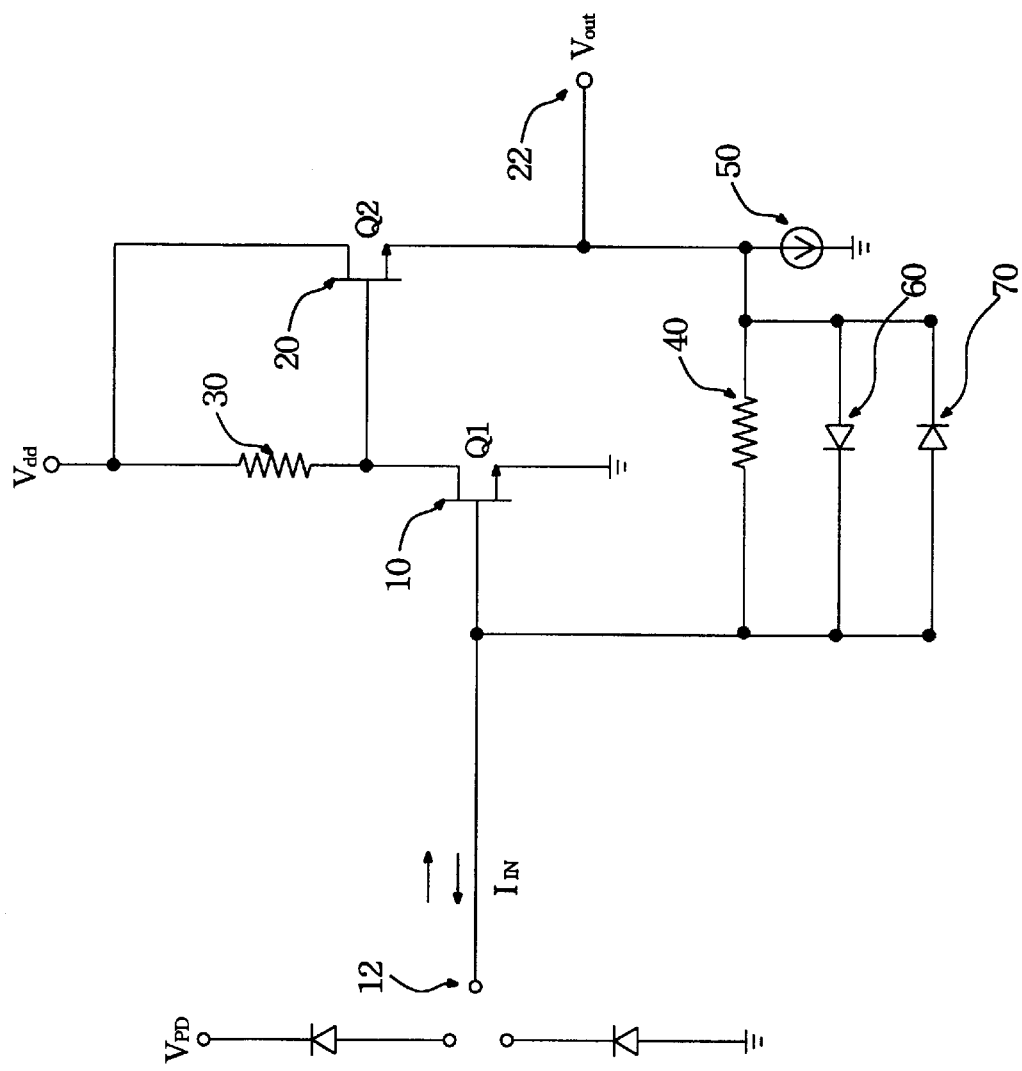
FIG. 3 is a schematic of improved high dynamic range optical receive preamplifier.

In recent years, popularly using the structure of the transimpedance. In the preferred embodiment of the invention, providing a transimpedance feedback path between the output node and the input node that comprises a feedback resister and the two diodes are coupled ("paralleled") in opposite direction (shown in FIG. 3). The preferred embodiment of the invention includes an input transistor 10, an output transistor 20, a load resistor 30, a feedback resistor 40, a current signal source 50 and the two diodes 60, 70 are coupled ("paralleled") in opposite direction. The input current ($I_{IN}$) is applied to the gate of transistor 10 by the input node 12 and the output voltage ($V_{OUT}$) is derived from the source output node 22 of transistor 20. While the reverse bias into the diode, namely the positive power into the cathode of the diode, the negative power into the anode of the diode. Then diode is open and the current is zero. While the forward bias into the diode, namely the positive power into the anode of the diode, the negative power into the cathode of the diode. Then diode is close and the voltage between the each node is about equal to the threshold voltage of the diode. According as the feedback network of the whole preamplifier, no matter which the reverse bias or the forward bias. The two diodes are coupled ("paralleled") in opposite direction enable above two input methods to work, that is to say, can work under the large signal current. The two diodes are paralleled with transimpedance feedback resistor. While the input current signal is too large, and the voltage reach the diode's threshold voltage. The preamplifier can provide current path passing the signal to maintain the proper DC voltage level and solve the problem that charge-discharge time is not uniform and changed over duty-cycle. Thus, increase the dynamic range of the transimpedance preamplifier.

Figure 4:
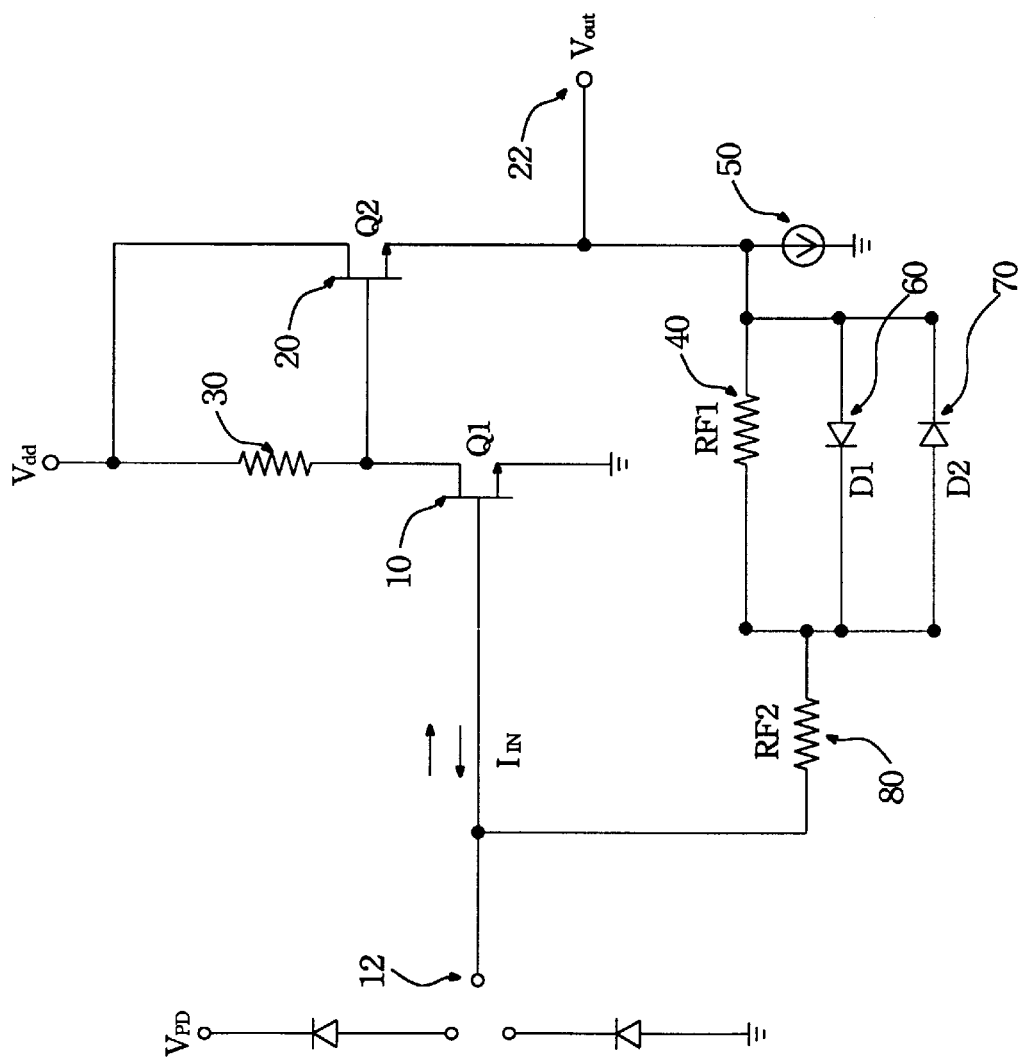
FIG. 4 is a schematic of improved high dynamic range optical receives preamplifier.

According to another preferred embodiment of the invention, the low impedance of series resistance connects with input node and feedback network (shown in FIG. 4). Including an input transistor 10, an output transistor 20, a load resistor 30, a feedback resistor 40, a current signal source 50, the two diodes 60, 70 are coupled ("paralleled") in opposite direction and a low impedance of series resistance. The input current ($I_{IN}$) is applied to the gate of transistor 10 by the input node 12 and the output voltage ($V_{OUT}$) is derived from the source output node 22 of transistor 20. The influence of bandwidth and stability that the aforementioned two paralleled diodes resulted in diode junction capacitor will reduce due to the low impedance of series resistance. And more specifically, in high-speed application, also increase the impedance of series resistance.

According to the aforementioned purpose, The present invention works under the large-signal current by anode or cathode input, and substantially improves traditional problem of the Automatic Gain Control and DC Restore Function.

The present invention improves high dynamic range preamplifier by using much less devices to maintain the bandwidth and stability of the circuit and large signal-to-noise ratio, and enhance the sensitivity of the fiber optic receiver.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A apparatus for high dynamic range optical receive preamplifier, such apparatus comprising:

a preamplifier having an input transistor and an output transistor, said preamplifier, having a feedback resistor coupled to the source output node of said output transistor and said feedback resistor, and convert a current signal of the input into an amplified voltage signal of the output;

a loaded resistor is coupled to said gate input node of said output transistor and said drain of said output transistor, and providing work region of said output transistor;

two diodes are paralleled in opposite direction, said two diodes are paralleled with said feedback resistor.

a series resistor is coupled to said gate of said input transistor and said feedback resistor.

2. The apparatus of claim 1, wherein said drain of said input transistor connected with said gate of said output transistor.

3. The apparatus of claim 1, wherein said source of said input transistor coupled to the said grounding.

4. The apparatus of claim 1, wherein said drain of said input transistor are series to power by said loaded resistor.

5. The apparatus of claim 1, wherein said drain of said output transistor is connected to said power.

6. The apparatus of claim 1, wherein said source of said output transistor is coupled to said grounding by said current source.

7. The apparatus of claim 1, wherein said input current signal input by anode or cathode methods.

* * * * *